United States Patent
Allegato et al.

(10) Patent No.: US 11,945,712 B2
(45) Date of Patent: Apr. 2, 2024

(54) PROCESS FOR MANUFACTURING A MICRO-ELECTRO-MECHANICAL DEVICE, AND MEMS DEVICE

(71) Applicant: STMicroelectronics S.r.l., Agrate Brianza (IT)

(72) Inventors: Giorgio Allegato, Monza (IT); Lorenzo Corso, Ruginello (IT); Ilaria Gelmi, Verano Brianza (IT); Carlo Valzasina, Gessate (IT)

(73) Assignee: STMICROELECTRONICS S.r.l., Agrate Brianza (IT)

(*) Notice: Subject to any disclaimer, the term of this patent is extended or adjusted under 35 U.S.C. 154(b) by 210 days.

(21) Appl. No.: 17/320,993

(22) Filed: May 14, 2021

(65) Prior Publication Data

US 2021/0363000 A1    Nov. 25, 2021

(30) Foreign Application Priority Data

May 20, 2020    (IT) .................. 102020000011755

(51) Int. Cl.
*B81B 3/00* (2006.01)
*B81C 1/00* (2006.01)

(52) U.S. Cl.
CPC ........ *B81B 3/0051* (2013.01); *B81C 1/00595* (2013.01); *B81B 2201/0235* (2013.01);
(Continued)

(58) Field of Classification Search
CPC .......... B81B 3/0051; B81B 2203/0307; B81B 2203/053; B81C 1/00595; B81C 2201/0177
See application file for complete search history.

(56) References Cited

U.S. PATENT DOCUMENTS

2006/0042385 A1   3/2006   Sassolini et al.
2010/0297781 A1   11/2010  Scheurle
(Continued)

FOREIGN PATENT DOCUMENTS

DE   10 2013 222 664 A1   5/2015

OTHER PUBLICATIONS

Classen et al., "Advanced Surface Micromachining Process—A First Step Towards 3D MEMS," MEMS 2017, Las Vegas, NV, Jan. 22-26, 2017, pp. 314-318.
(Continued)

*Primary Examiner* — Moazzam Hossain
(74) *Attorney, Agent, or Firm* — Seed IP Law Group LLP (57) ABSTRACT

A process for manufacturing a MEMS device includes forming a first structural layer of a first thickness on a substrate. First trenches are formed through the first structural layer, and masking regions separated by first openings are formed on the first structural layer. A second structural layer of a second thickness is formed on the first structural layer in direct contact with the first structural layer at the first openings and forms, together with the first structural layer, thick structural regions having a third thickness equal to the sum of the first and the second thicknesses. A plurality of second trenches are formed through the second structural layer, over the masking regions, and third trenches are formed through the first and the second structural layers by removing selective portions of the thick structural regions.

16 Claims, 10 Drawing Sheets

(52) U.S. Cl.
CPC .............. *B81B 2201/0242* (2013.01); *B81C 2201/0198* (2013.01)

(56) References Cited

U.S. PATENT DOCUMENTS

| | | |
|---|---|---|
| 2011/0056295 A1 | 3/2011 | Classen |
| 2013/0043548 A1 | 2/2013 | Reinmuth et al. |
| 2014/0054730 A1* | 2/2014 | Graham ............... B81B 3/0021 257/415 |
| 2015/0217996 A1* | 8/2015 | Chu .................... B81C 1/00269 438/48 |
| 2019/0016592 A1* | 1/2019 | Stehle ................. B81B 3/0016 |
| 2021/0331916 A1* | 10/2021 | Urban ................. B81C 1/00015 |
| 2022/0041429 A1 | 2/2022 | Rizzini et al. |

OTHER PUBLICATIONS

Rabinovich et al., "The Effect of Release-Etch Holes on the Electromechanical Behavior of MEMS Structures," Transducers '97—1997 International Conference on Solid-State Sensors and Actuators, Chicago, IL, Jun. 16-19, 1997, pp. 1125-1128.

* cited by examiner

PROCESS FOR MANUFACTURING A MICRO-ELECTRO-MECHANICAL DEVICE, AND MEMS DEVICE

BACKGROUND

Technical Field

The present disclosure relates to a process for manufacturing a micro-electro-mechanical (MEMS) device, in particular a movement sensor with capacitive control/detection and MEMS device thereof.

Description of the Related Art

Specifically, the considered MEMS device comprises two superimposed structural layers forming at least one structure movable in the plane or out of the plane of one of the structural layers (so called "in-plane" or "out-of-plane" mobile structures); the movable structure may, for example, be a Z-detection sensor and have a first mass or first movable electrodes formed in one of the structural layers, tiltable around a horizontal axis and capacitively coupled to a second mass or to second fixed electrodes formed in the other structural layer.

In particular, in the following description, reference will be made to a MEMS movement sensor and to the problems for the manufacturing thereof; however the present disclosure generally applies to other types of MEMS devices.

For example, the MEMS device may comprise one or more of the following structures, single or coupled to each other (combo): accelerometer, gyroscope, geophone, inclinometer and resonator. Furthermore, the MEMS device may be a MEMS actuator.

Micromechanical devices of this type are widely used in consumer, automotive and industrial applications.

As known, during the design of this type of devices, several aspects are to be taken into account, the most relevant whereof are:

1) Reduction of device size, in order to reduce manufacturing costs and improve the integration of the device into portable apparata, so that the device has low footprint both in terms of cost and bulk;
2) Sensitivity improvement, i.e., high ratio between the variation of the detected signal and the trend of the monitored physical quantity (acceleration/rotation) i.e., between the performed movement and the control signal, in the case of actuators;
3) Performance stability in presence of mechanical stress resulting from package, from soldering processes or from temperature;
4) Mechanical strength in case of falls and impacts.

Nowadays, devices of this type are manufactured using different types of technologies. For example, the Applicant has developed a technology comprising the growth of a thick epitaxial layer (which is the structural layer accommodating the detection or actuation structures) over a sacrificial layer that is removed at the end of the manufacturing using hydrofluoric acid vapors.

Figures 1, 2:
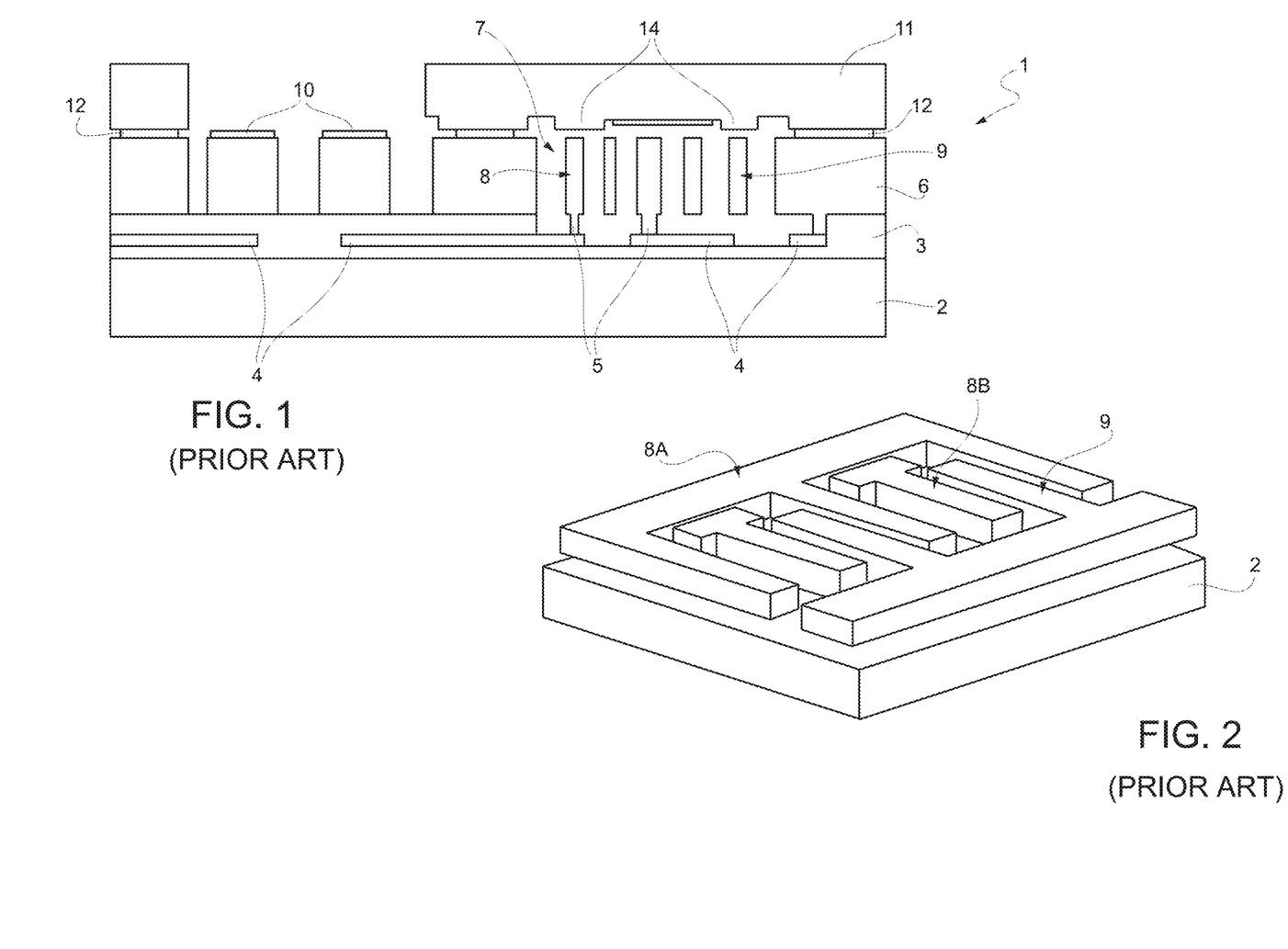
FIG. 1 is a cross-section of a known capacitive MEMS sensor.
FIG. 2 is a perspective view, with removed parts, of the sensor of FIG. 1.

FIGS. 1 and 2 show, for example, a generic MEMS sensor 1 obtainable with this process, and comprising forming, on a substrate 2, for example of monocrystalline silicon, a dielectric layer (which partially forms an insulating layer 3); forming, on the dielectric layer, conductive regions 4 (forming electrodes and interconnections); growing, over the dielectric layer and the conductive regions 4, a sacrificial layer (a part whereof is visible in FIG. 1 and forms, together with the dielectric layer, the insulating layer 3); etching the sacrificial where it is desired to form anchoring elements to the substrate 2; performing a polycrystalline silicon epitaxial growth, forming anchors 5 and a structural layer 6; performing a dry silicon etch for defining a MEMS structure 7 in the structural layer; and selectively etching the sacrificial layer, for releasing movable elements of the MEMS structure 7. For example, FIG. 2 shows the structure of first and second fixed electrodes 8A, 8B (generically indicated by 8 in FIG. 1) and movable electrodes 9 of interdigitated type, which form the MEMS structure 7, here a capacitive detection structure.

Typically, the process further comprises final steps including forming metal connection regions 10, and bonding a cap 11 through a bonding layer 12 (for example of glassfrit).

In particular, the cap 11 may also be formed of semiconductor material, from a processed silicon wafer, so to have auxiliary structures. For example, in FIG. 1, the cap 11 is recessed at the electrodes 8A, 8B and 9 and has projecting portions 14 directed towards the MEMS structure 7 and forming vertical movement stoppers of the MEMS structure 7 (so-called Z stoppers).

The cap 11 has a sealing, also hermetic, function and has the aim of protecting the MEMS structure 7 from the external environment (humidity, dust, etc.), as well as from impacts. Its formation from a semiconductor wafer allows to use back-end process technologies such as testing, dicing, packaging and to obtain uniform performance and durability over time of the packaged device.

The process described hereinabove has allowed to manufacture inertial devices and, in particular, movement sensors (such as accelerometers, gyroscopes) with high electrical, mechanical and reliability characteristics, at reduced costs, which have determined a significant commercial success thereof, but is liable to improvement.

For example, the effectiveness and operativeness of the vertical stoppers (projecting portions 14) are linked to the thickness of the bonding layer 12 (typically 5-7 µm), optimized with respect to its bonding function, and therefore not always with respect to the limitation of the desired vertical movement.

Furthermore, this solution does not allow two detection structures to be staked in the same packaged device. As a result, when the apparatus using the packaged device uses multiple devices, of different type or intended for the detection on different axes, the various devices are arranged adjacent on a support (for example a board) or stacked on each other, resulting in space occupation.

Furthermore, the possibility of limiting the vertical (out-of-plane) movement of the MEMS structure 7 is limited by the thickness of the bonding layer 12, deriving from implementation considerations not linked to the stop function and thus not always optimized with respect to desired values of the allowed movement.

Patent application US 2013/0043548 describes a manufacturing process comprising forming, over a first insulating layer extending on substrate, a first polysilicon micromechanical functional layer, which is then patterned to form delimitation trenches having a size that may be subsequently filled with a second insulating layer and form, i.a., pillar structures. Then, part of the first micromechanical functional layer arranged between the pillar structures is selectively removed, to form cavities; a third insulating layer, selectively removed to locally expose the contact regions, is formed over the remaining portions of the first micromechanical functional layer (including contact regions) and of the pillar structures. Then a second micromechanical functional layer is formed and is in direct electrical contact with the contact regions, where the second insulating layer has been removed. Then, the second micromechanical functional layer is defined to form access openings to the lower layers; finally, the third insulating layer, the second insulating layer, the pillar structures and the first insulating layer are selectively removed.

However, this process also suffers from limitations, since the height of the first micromechanical functional layer is limited by the ability of the pillar structures to support the second micromechanical functional layer over the cavities and by the criticality of the pillar structures themselves, which have reduced width (due to the width of the trenches manufactured therein). In fact, as emphasized in this document, the trenches wherein the pillar structures are formed are to be very thin, which may give rise to filling difficulties, with formation of defective pillar structures, which may cause the removal of polycrystalline silicon portions from areas where they should be, during the selective removal process of the first polysilicon and the deposition of polysilicon in the defective trenches in undesired areas. Furthermore, the thinness of the pillar structures limits the height thereof.

BRIEF SUMMARY

In various embodiments, the present disclosure provides solutions which overcomes the drawbacks of the prior art.

According to the present disclosure, a process for manufacturing a MEMS device and a MEMS device are provided.

In at least one embodiment, a process for manufacturing a MEMS device is provided that includes: forming a first structural layer of semiconductor material on a substrate, the first structural layer having a first thickness; forming a plurality of first trenches extending through the first structural layer and defining first functional elements; forming masking regions on the first structural layer, the masking regions being separated from each other by first openings; forming a second structural layer of semiconductor material on the first structural layer and on the masking regions, the second structural layer having a second thickness, being in direct contact with the first structural layer at the first openings and forming, together with the first structural layer, thick structural regions of the semiconductor material having a third thickness equal to the sum of the first and the second thicknesses; forming a plurality of second trenches extending through the second structural layer, over the masking regions; and forming a plurality of third trenches extending through the first and the second structural layers by removing selective portions of the thick structural regions.

In at least one embodiment, a MEMS device is provided that includes a substrate. A first structural layer has a first thickness and extends on the substrate. A second structural layer has a second thickness and extends on the first structural layer. A plurality of first trenches extend through the first structural layer and define first functional elements. A plurality of second trenches extend through the second structural layer and define second functional elements overlying the first functional elements. A plurality of third trenches extend through the first and the second structural layers. The first and the second structural layers form a supporting structure, having a third thickness equal to the sum of the first and the second thicknesses, anchored to the substrate and supporting the first and the second functional elements. A first gap zone extends between the first and the second functional elements and surrounds the supporting structure.

In at least one embodiment, a method is provided that includes: forming a plurality of first trenches extending through a first semiconductor layer and defining first functional elements, the first semiconductor layer having a first thickness; forming masking regions on the first semiconductor layer, the masking regions being separated from each other by openings; forming a second semiconductor layer on the first semiconductor layer and on the masking regions, the second semiconductor layer directly contacting the first semiconductor layer at the openings; forming a plurality of second trenches extending through the second semiconductor layer and at least partially exposing portions of the masking regions; forming a cavity and a plurality of third trenches by selectively removing portions of the second semiconductor layer, the cavity overlying at least one of the masking regions, the plurality of third trenches extending from the cavity through the second semiconductor layer.

BRIEF DESCRIPTION OF THE SEVERAL VIEWS OF THE DRAWINGS

For a better understanding of the present disclosure, embodiments thereof are now described, purely by way of non-limiting example, with reference to the attached drawings, wherein.

DETAILED DESCRIPTION

Figure 3:
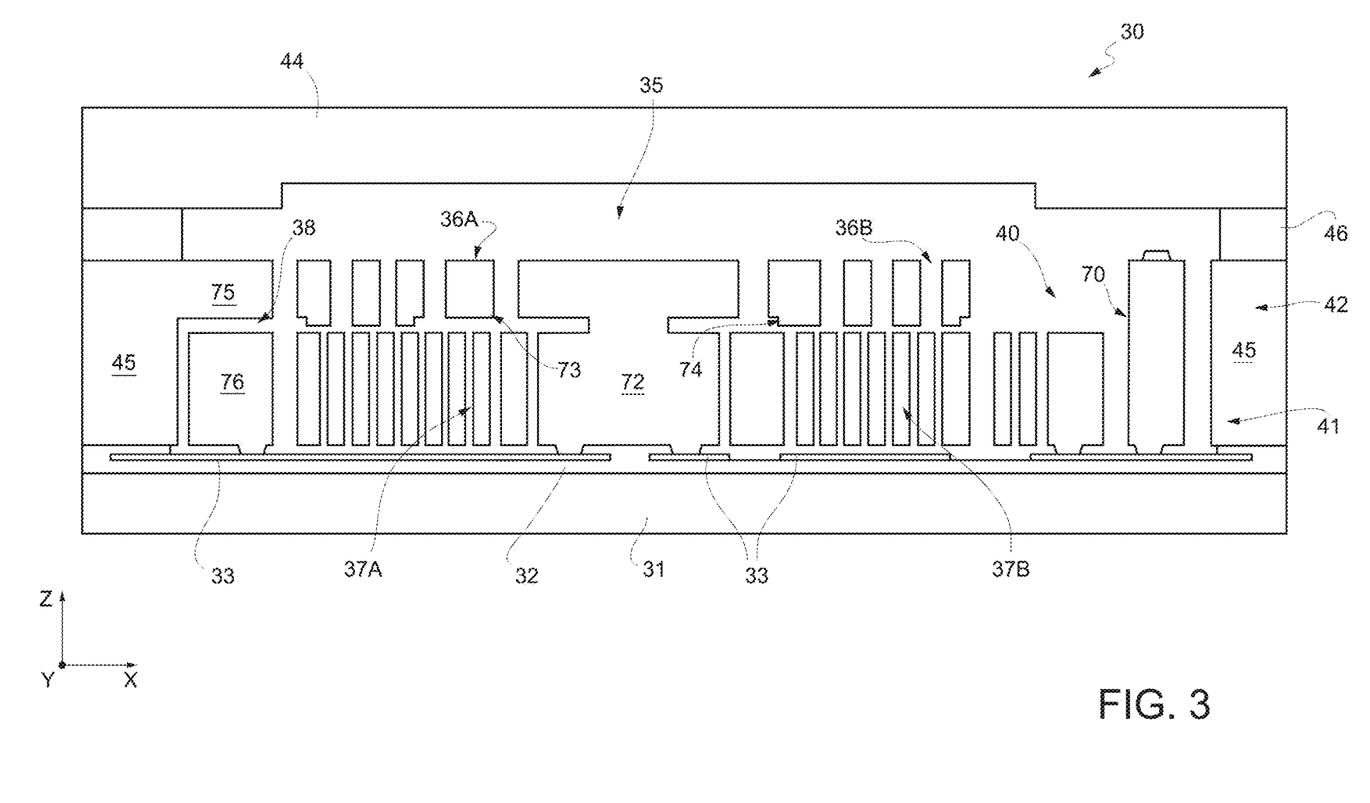
FIG. 3 is a cross-section of an embodiment of the present MEMS device.

FIG. 3 shows a MEMS device 30 comprising a substrate 31; an insulating layer 32 over the substrate 31; conductive regions 33 over and partially inside the insulating layer 32; a first micromechanical structure 35, here an differential sensor for out-of-plane movement (for example an Z-accelerometer or a gyroscope with pitch and roll movement), having a pair of upper electrodes 36A, 36B and a pair of bottom electrodes 37A, 37B; a Z-stopper structure 38; a second micromechanical structure 40, for example a gyroscope or an accelerometer of reduced thickness, and a cap 44, attached to a fixed portion 45 of the MEMS device 30 through a bonding layer 46.

The first and the second micromechanical structures 35, 40, the Z-stopper structure 38 and the fixed portion 45 are formed by two structural layers epitaxially grown on each other (first and second epitaxial layers 41, 42), as described in detail hereinbelow with reference to FIGS. 4-15.

Figure 4:
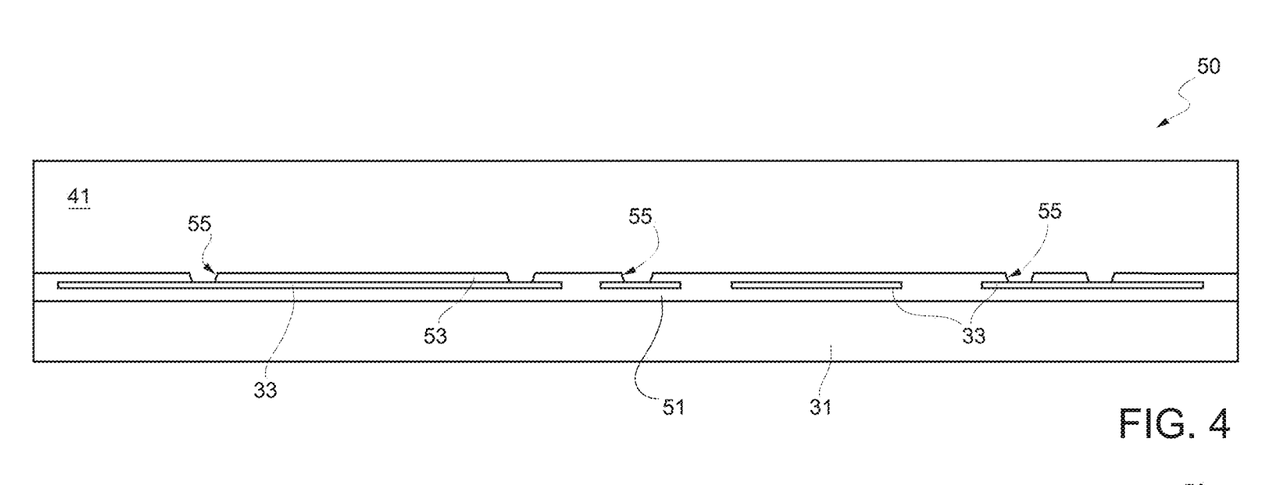
FIGS. 4-12 are cross-sectional views of a semiconductor wafer in successive steps for manufacturing the MEMS device of FIG. 3, according to an embodiment.

FIG. 4 shows a wafer 50 comprising the substrate 31 of semiconductor material, such as monocrystalline silicon; a first dielectric layer 51, for example of silicon oxide, extending over the substrate 31; the conductive regions 33, for example of deposited polycrystalline silicon, extending over the first dielectric layer 51; a first sacrificial layer 53, for example of thermally grown or deposited silicon oxide, which extends over the conductive regions 33 and the first dielectric layer 51; and the first epitaxial layer 41, of silicon, over the first sacrificial layer 53.

Over the conductive regions 33, the first sacrificial layer 53 has first anchoring openings 55 formed through a masking and etching step and accommodating anchoring portions 56 formed by the first epitaxial layer 41. The anchoring portions 56 also form electrical contact and biasing structures of the micromechanical structures 35, 40 as well as any other regions and structures of the MEMS device 30.

The first epitaxial layer 41 has a thickness linked to the desired micro-electro-mechanical structures, which may range, for example, between 2 and 80 μm. After the epitaxial growth, the first epitaxial layer 41 is planarized and brought to the desired final thickness, for example through CMP (Chemical Mechanical Polishing).

Figure 5:
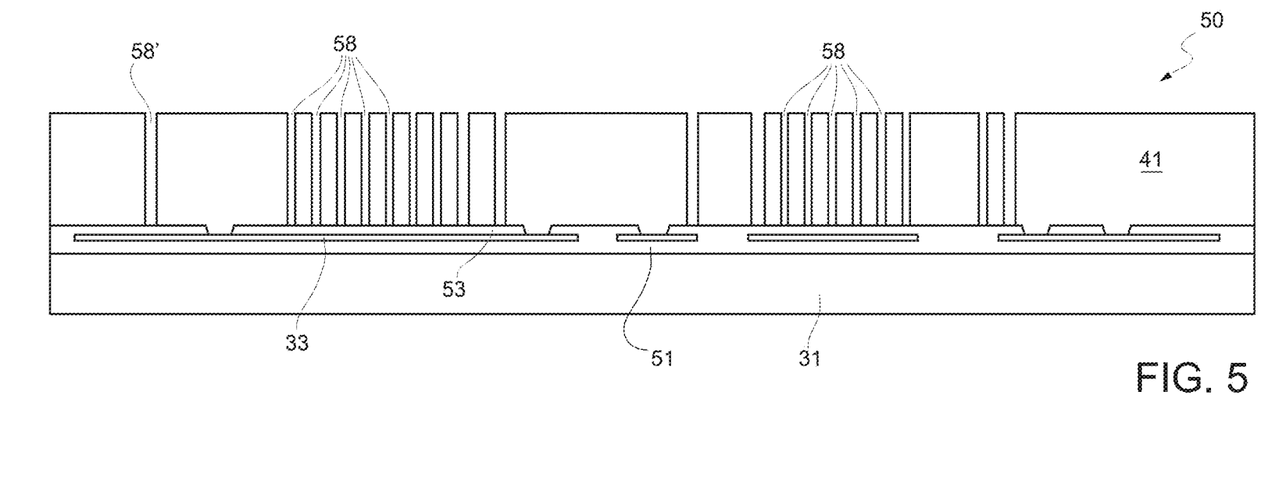

In FIG. 5, the first epitaxial layer 41 is etched to define lower portions of the desired structures and other intended regions. To this end, the wafer 50 is covered by a resist mask (first trench mask), not shown, and subject to a dry etching, thus forming first trenches 58, which extend throughout the first epitaxial layer 41. The first trenches 58 are of thin type, with a minimum width (for example of 2 μm). The etching automatically stops on the first sacrificial layer 53 and leads here to the definition of the bottom electrodes 37A, 37B and of electrodes of the second micromechanical structure 40 as well as of other structures. In particular, in this step, a trench (indicated with 58') is formed for delimiting the first Z-stopper structure 38, as well as any other regions whose definition may not be performed (at least completely) through the second epitaxial layer 42.

Figure 6:
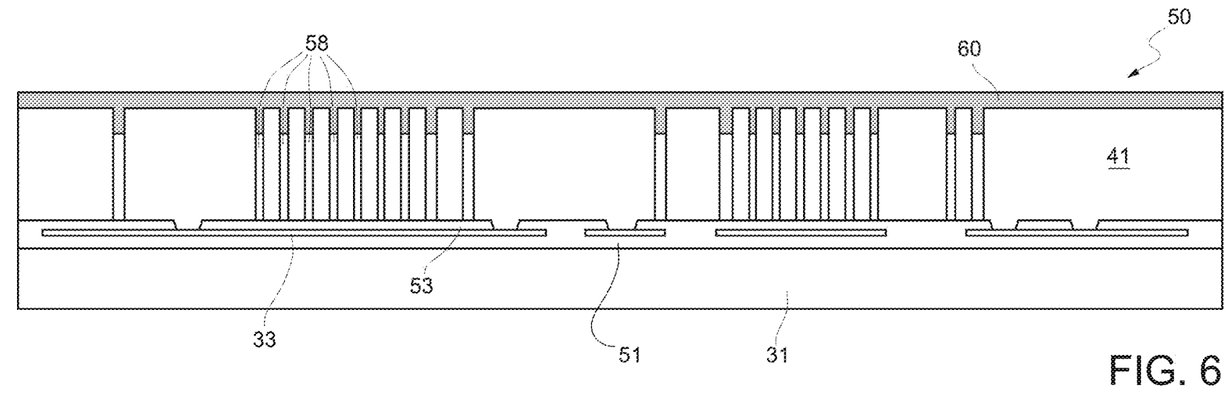

Then, FIG. 6, a second sacrificial layer 60, for example of TEOS (Tetraethyl Orthosilicate), is deposited for a thickness comprised, for example, between 1 and 2 μm. The second sacrificial layer 60 partially fills the first trenches 58, for example for a third of their depth (for example for 5-10 μm), although this filling, as well as the filling extent and depth are not important. Then, the second sacrificial layer 60 is planarized.

Figure 7:
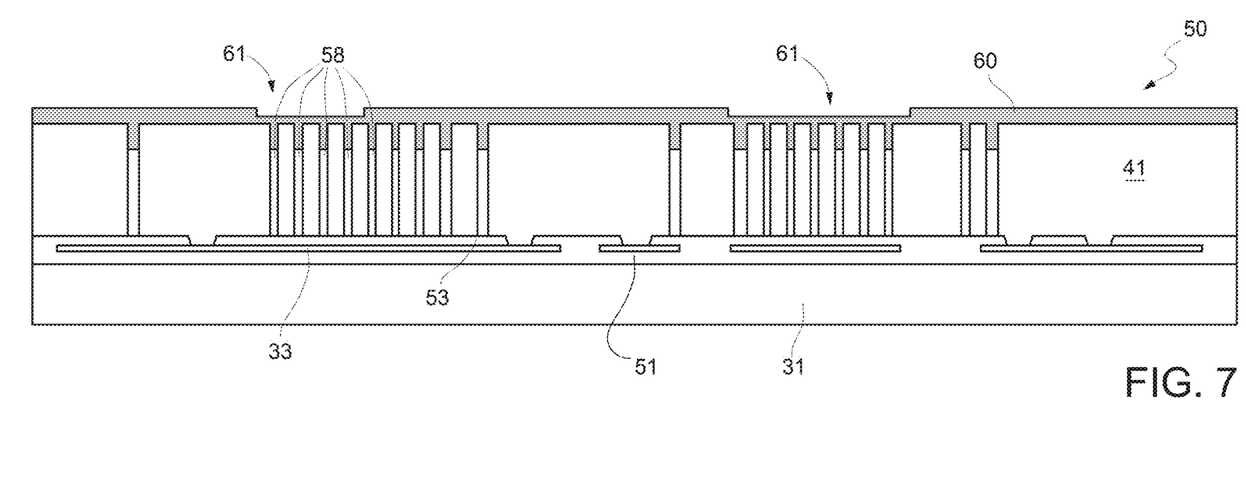

In FIG. 7, the second sacrificial layer 60 is thinned where portions are desired that have the second epitaxial layer 42 projecting downwardly or that are at a reduced distance from the first epitaxial layer 41, as described hereinbelow. To this end, a masked etching, for example time-etching, is performed in a known manner, by using a not-shown masking layer (bump mask), to form grooves 61. Here, the grooves 61 extend for example over the bottom electrodes 37A, 37B, where it is desired that the distance between the bottom electrodes 37A, 37B and the upper electrodes 36A, 36B is reduced (FIG. 3), to delimit the contact areas that limit the out-of-plane displacements (bump) and to increase the out-of-plane capacitance in the Z-detection areas. Similarly, and in a not shown manner, the grooves 61 may be formed in other zones of the device where desired, as discussed in detail hereinbelow.

Figure 8:
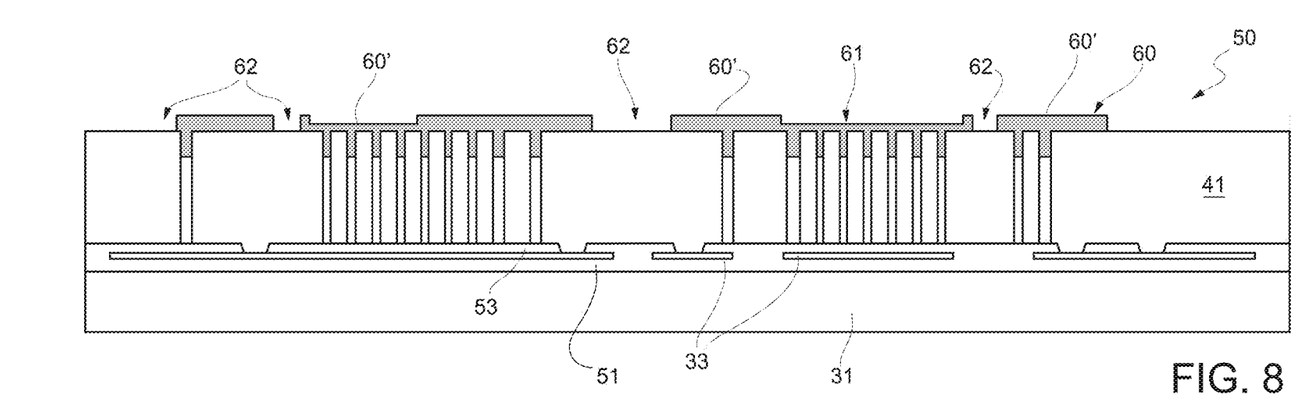

In FIG. 8, the second sacrificial layer 60 is further etched and selectively removed for its entire thickness, using a masking layer not shown (second anchoring mask), thus forming anchoring openings 62. The etching of the second sacrificial layer 60 leads to the formation of hard masking regions 60' and automatically ends on the first epitaxial layer 41.

In general, the second anchoring openings 62 are formed where connection regions between the first and the second epitaxial layers 41, 42 are desired. In particular, here, the second anchoring openings 62 are formed where the second epitaxial layer 42 is anchored to the first epitaxial layer 41, where wide trenches in the first and the second epitaxial layers 41, 42 are desired as well as where alignment structures are desired. Furthermore, the hard masking regions 60' have the aim of allowing the definition of structures formed only in the first epitaxial layer 41 and delimited by wide trenches, as discussed hereinbelow.

In particular, as a result of the grooves 61, the hard masking regions 60' have two different thicknesses: a greater thickness equal to the thickness of the second sacrificial layer 60, and a smaller thickness at the grooves 61.

Subsequently, FIG. 9, the second epitaxial layer 42 is grown, for a thickness here again depending on the desired micro-electro-mechanical structures, and which may be comprised here again between 2 and 80 μm. In general, the second epitaxial layer 42 may be thinner than the first epitaxial layer 41, although the inverse may occur and the disclosure is not limited to any particular ratio between the thicknesses of the epitaxial layers 41, 42.

After the epitaxial growth, the second epitaxial layer 42 is planarized and brought to the desired final thickness, for example through CMP (Chemical Mechanical Polishing). In this manner, the structural layer formed by the first and the second epitaxial layers 41, 42, also referred to as overall epitaxial layer 64, reaches a final thickness, typically comprised between 20 and 80 μm.

Figure 10:
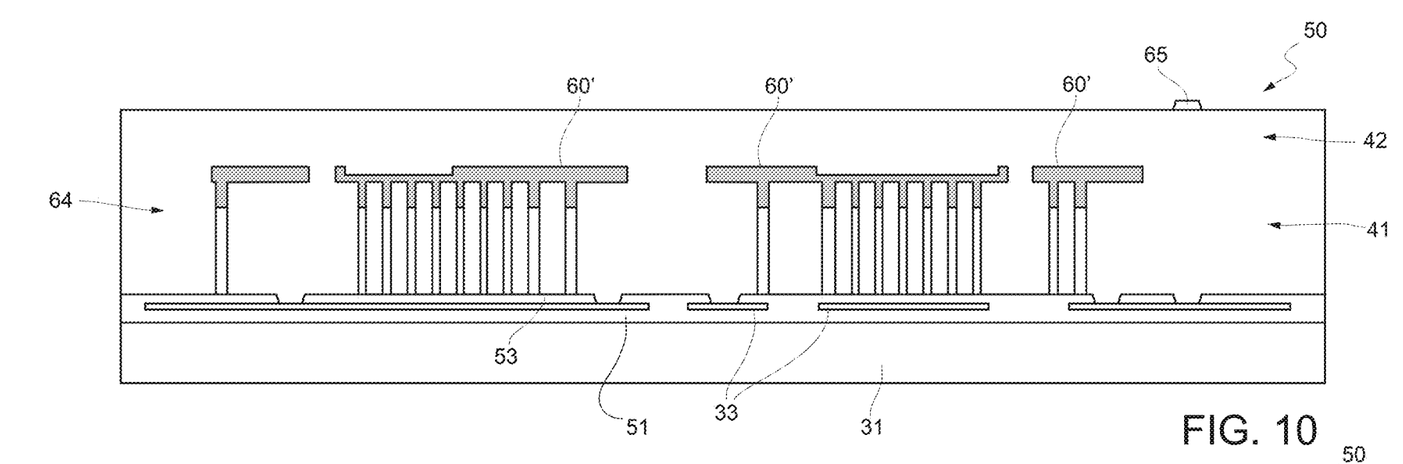

In FIG. 10, electrical connection regions 65 (one in figure) are formed on the upper surface of the overall epitaxial layer 64, by depositing and patterning a metal layer, for example of aluminum or gold, to define the contact pads.

Figure 11:
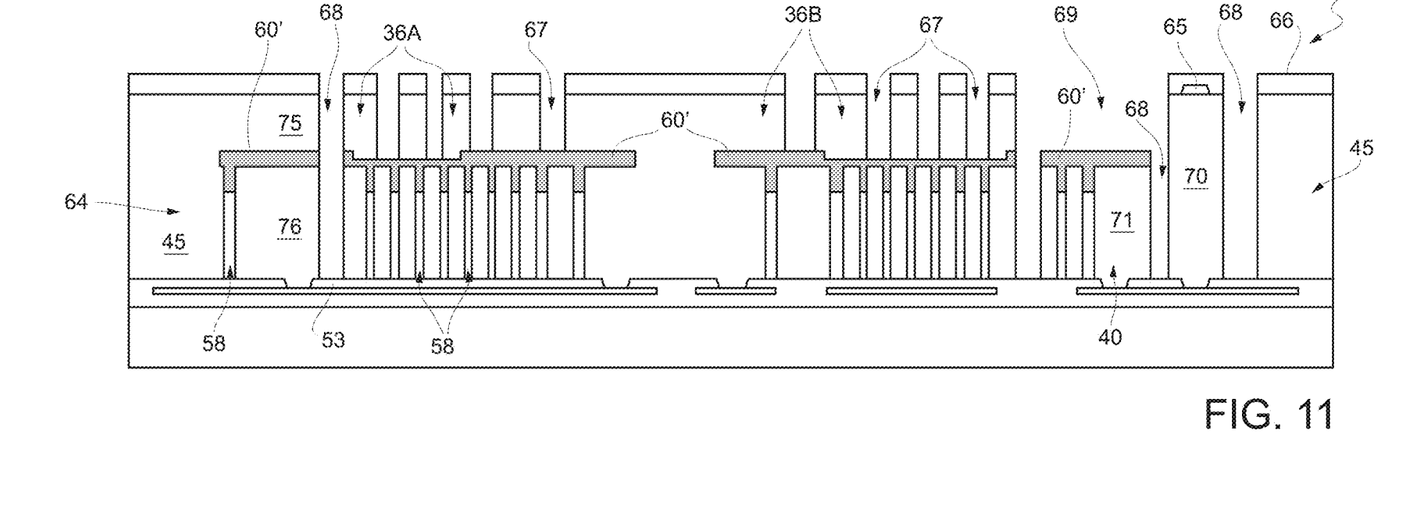

In FIG. 11, the wafer 50 is etched. To this end, the wafer 50 is covered by a resist mask (second trench mask 66) and dry etched. In this step, the portions of the epitaxial layers 41 and 42 not covered by the second trench mask 66 and not covered by the hard masking regions 60' are removed for the entire thickness of the overall epitaxial layer 64; in these zones, the etching stops on the first sacrificial layer 53. Conversely, the zones not covered by the second trench mask 66 but covered by the hard masking regions 60' are removed for the thickness of the second epitaxial layer 42 only.

In particular, in this step, second trenches 67, which extend between and define the upper electrodes 36A, 36B and have depth equal to the thickness of the second epitaxial layer 42; third trenches 68, which extend for the entire thickness of the overall epitaxial layer 64, define and delimit tall structures (here, for example, a carrier pillar region 70 which supports the electrical connection region 65 as well as the fixed portions 45); and cavities 69, which extend through the second epitaxial layer 42 and are delimited on the bottom by the hard masking regions 60', for the formation of structures having height equal to the thickness of the first epitaxial layer 41 (here, for example, at a low region 71 of the second micromechanical structure 40).

In some areas, the second and the third trenches 67, 68 as well as the cavities 69 may be wider than the first trenches 58.

Figure 12:
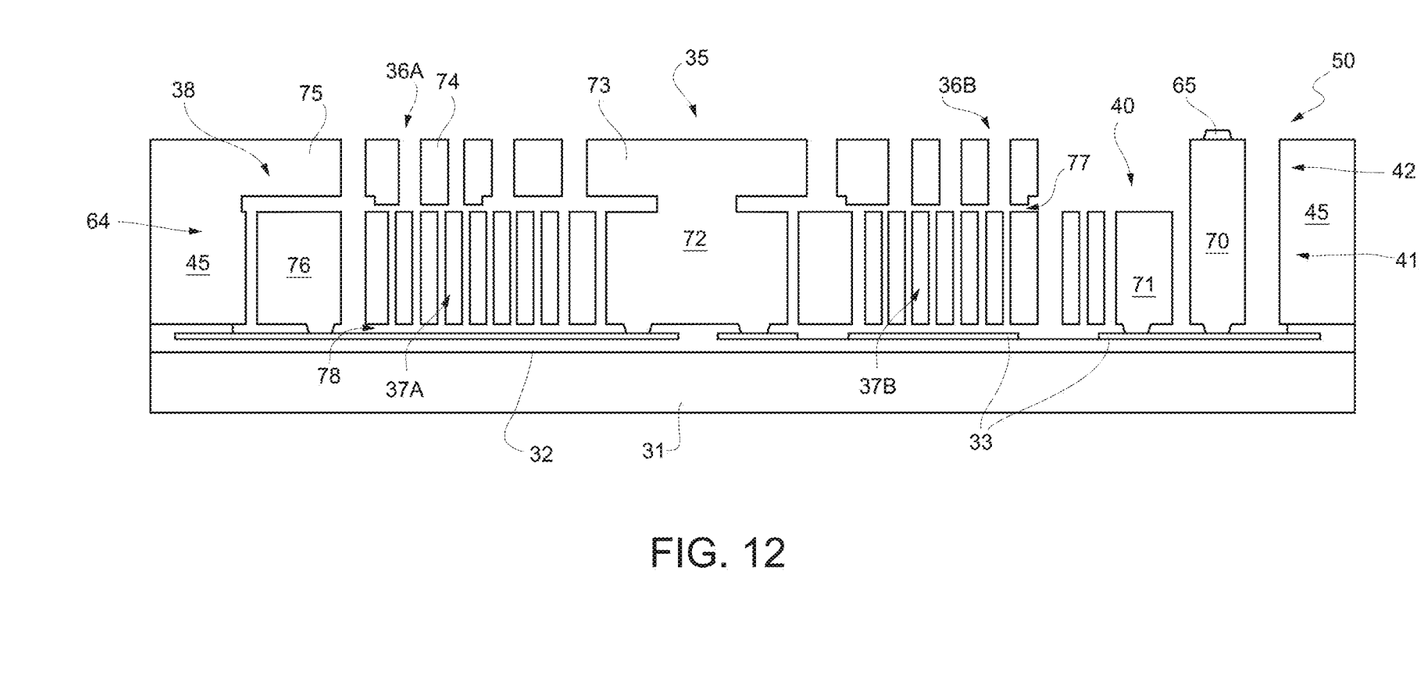

Subsequently, FIG. 12, the second trench mask 66 is removed; then the hard masking regions 60', the portions of the second sacrificial layer 60 inside the first trenches 58, the exposed portions of the first sacrificial layer 53 are removed, releasing the micromechanical structures 35, 40 and the Z-stopper structures 38 and forming first gap zones 77 between the upper electrodes 36A, 36B and the bottom electrodes 37A, 37B and second gap zones 78 below the bottom electrodes 37A, 37B, as well as the other suspended structures (also including electrodes of the second micromechanical structure 40).

Thus, the dielectric layer 51 and the remaining portions of the first sacrificial layer 53 form the insulating layer 32.

Finally, a cap wafer is bonded to the wafer 50 through the bonding layer 46 and the overall wafer is diced to form the MEMS device 30 of FIG. 3. Alternatively, the wafer 50 is diced and, on the die thus obtained, the cap 44 is bonded, obtaining the structure of FIG. 3, in a known manner.

In this manner, and referring again to FIG. 3, the first micromechanical structure 35 has bottom electrodes 37A, 37B of a first thickness, equal to the thickness of the first epitaxial layer 41; upper electrodes 36A, 36B of a second thickness, here smaller than the first thickness and equal, in first approximation, to the thickness of the second epitaxial layer 42; and a fixed central or anchoring portion 72, of a third thickness, equal, in first approximation, to the sum of the first and the second epitaxial layers 41, 42 (disregarding the thickness of the hard masking regions 60', which is negligible with respect to the thickness of the first and the second epitaxial layers 41, 42, and disregarding the thickness non-uniformity of the second epitaxial layer 42). Furthermore, the upper electrodes 36A, 36B have thinner portions 73 (where the hard masking regions 60' had greater thickness, equal to the thickness of the second sacrificial layer 60) and thicker portions 74, where the hard masking regions 60' were thinner.

Furthermore, the fixed portion 45 (forming here a perimeter wall surrounding the micromechanical structures 35, 40 and thus hereinafter referred to as wall 45) as well as the carrier pillar region 70 have a thickness equal to the sum of the first and the second epitaxial layers 41, 42.

In the MEMS device 30 of FIG. 3, the wall 45 also forms a projecting arm 75, extending horizontally inside the MEMS device 30 and overlying, at a distance, an abutment pillar 76, anchored to the substrate 31.

The projecting arm 75 and the abutment pillar 76 form the first Z-stopper structure 38 and are formed by the second epitaxial layer 42 and the first epitaxial layer 41, respectively, spaced from each other by a space equal to the thickness of the second sacrificial layer 60 (FIG. 7) which in this zone had a full thickness, for example 1.6 µm. Alternatively, if a cavity 61 is formed also in this area, the distance between the projecting arm 75 and the abutment pillar 76 may be equal to the distance between the upper and bottom electrodes 36, 37 and equal to the thickness of the hard masking regions 60'.

Figure 13A:
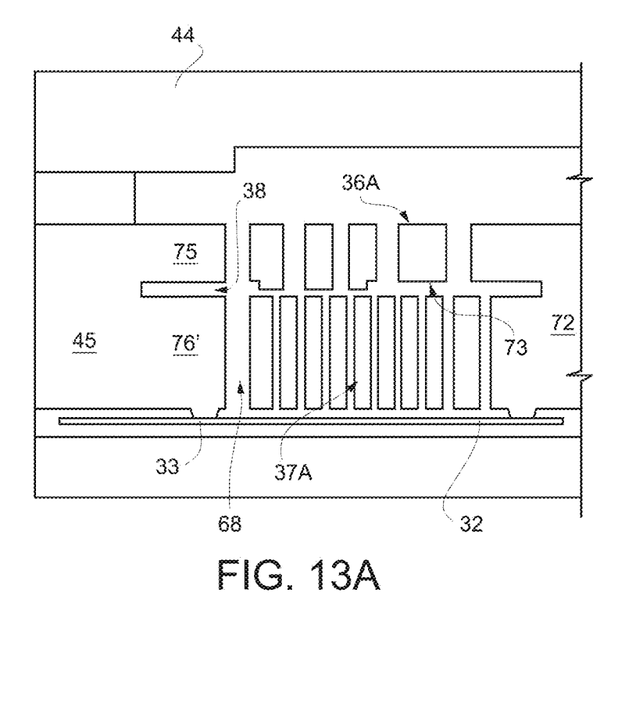
FIGS. 13A and 13B show different embodiments of a portion of the MEMS device of FIG. 3.

Furthermore, although in FIGS. 3-12 the abutment pillar 76 is completely surrounded by trenches (part of the first trench 58 and part of the third trench 68), this is not essential, and the abutment pillar 76 may be replaced by a bottom abutment region 76' only partially surrounded, for example, by the first trench 58, as shown in FIG. 13A.

Figure 13B:
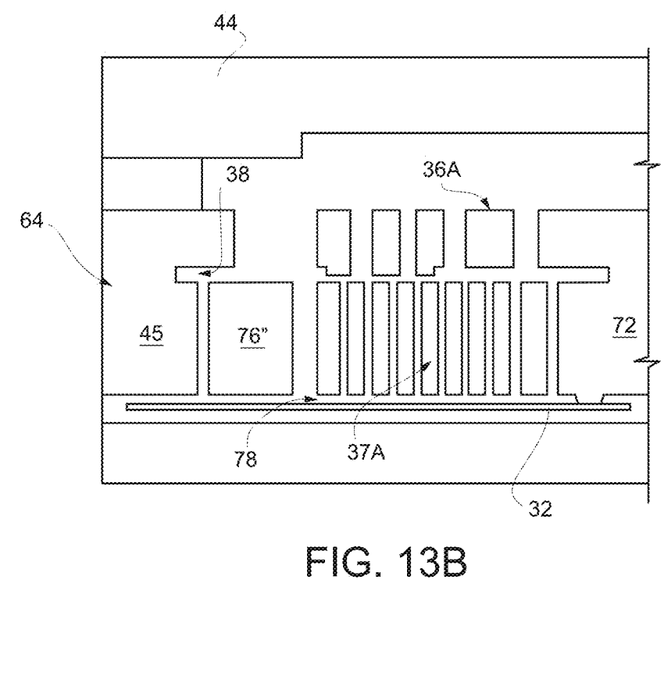

According to another alternative, shown in FIG. 13B, the abutment pillar 76 may be formed by an unanchored portion 76", supported by the first micromechanical structure 35.

The projecting arm 75 forms an upper abutment region obtainable through a suspended beam but it might be formed by an abutment wall of any shape.

In this manner, the Z-movement extent allowed to the micromechanical structures 35, 40 constrained to the substrate 31 may be set to less than 2 µm and may be controlled precisely through the thickness of the masking regions 60' (with precision of 10%), allowing improved performance in the event of a vertical impact or fall of the MEMS device 30.

Furthermore, the possibility of forming the electrodes (both upper 36A, 36B and lower 37A, 37B) in two epitaxial layers 41, 42 grown one on top of the other, provides improved performance. In fact, when the MEMS device 30 is finished, the epitaxial layers 41, 42 are monolithic to each other and have the same mechanical and electrical characteristics. Consequently, they behave in the same manner both towards external stresses (for example in the event that the substrate 31 undergoes a bending), since in this case they would deform in the same manner, and relative to degradation over time. The formation of the upper electrodes 36A, 36B and of the bottom electrodes 37A, 37B with central anchoring causes them to be insensitive to stress from the deformation of the substrate and caused by heat treatments or mechanical strains induced on the substrate, for example during soldering in the manufacturing step or during operation.

Figure 14:
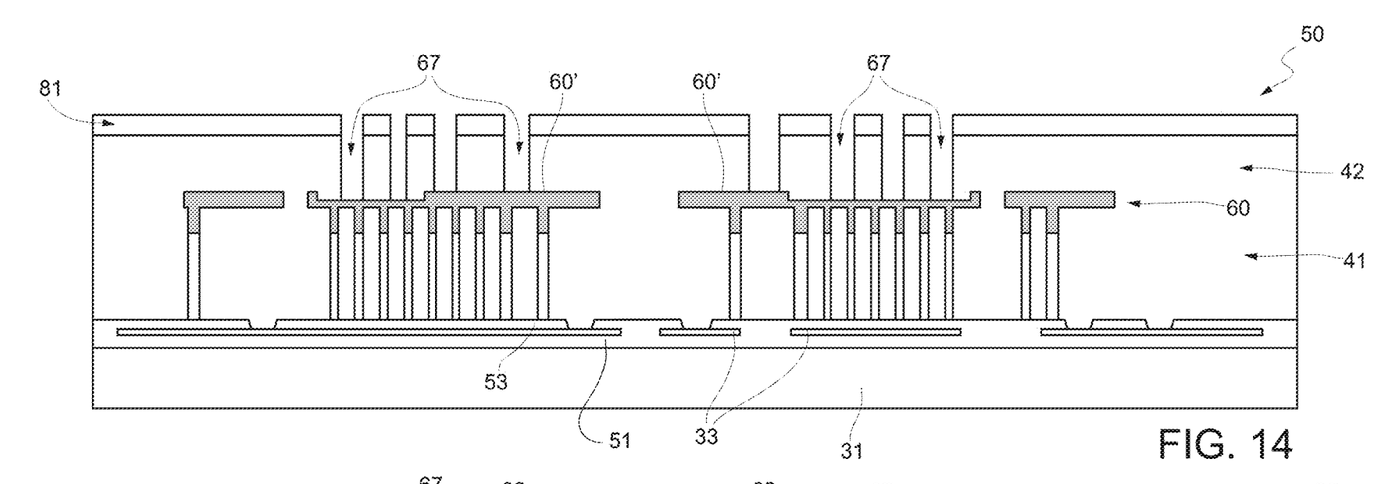
FIGS. 14-16 show variations of the steps of FIGS. 10-12, according to a different embodiment of the present process.
Figure 15:
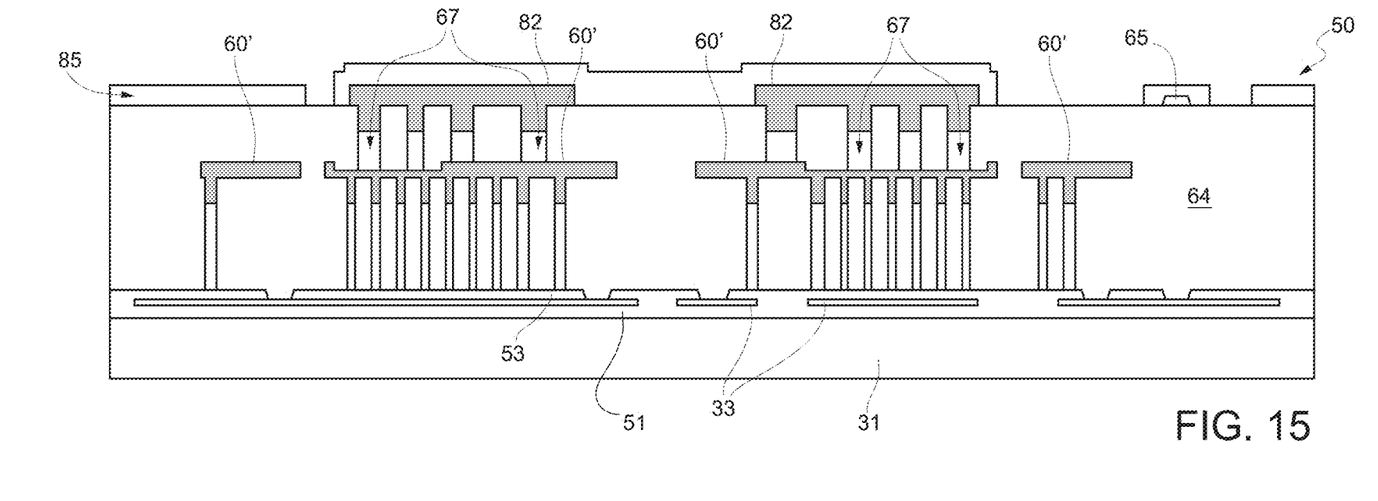
Figure 16:
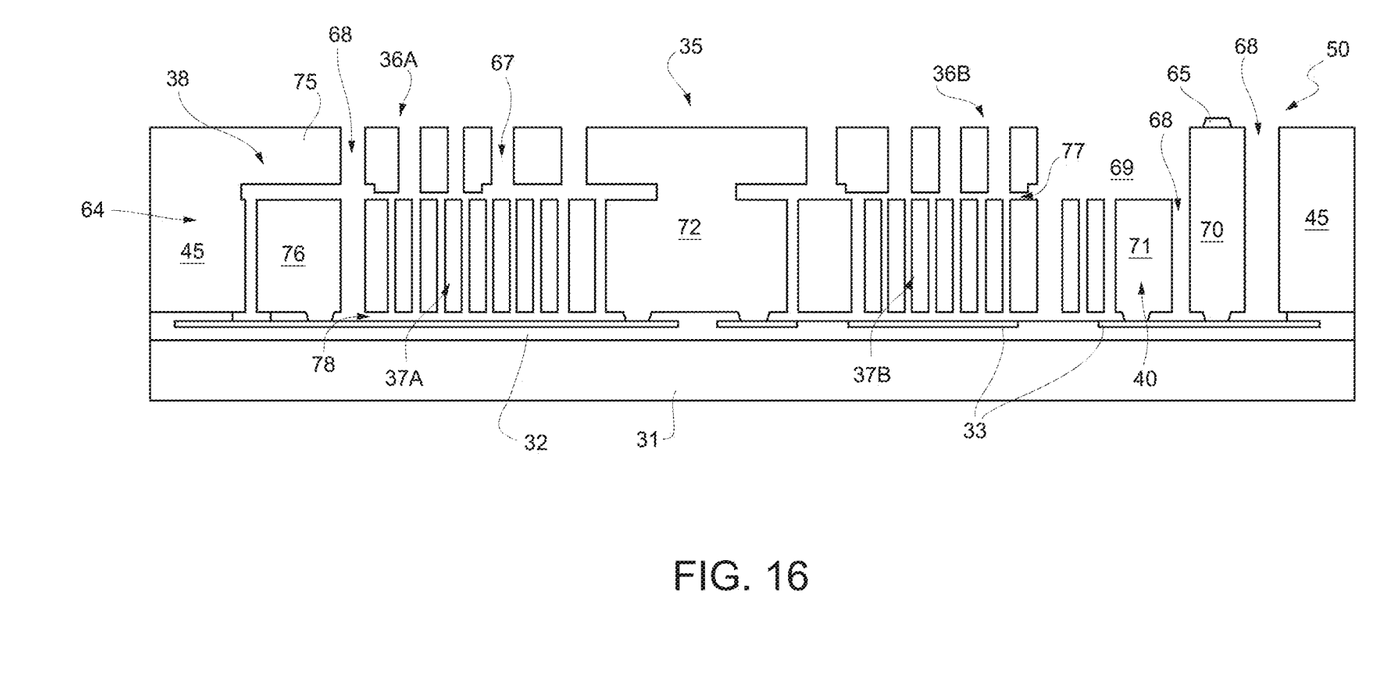

FIGS. 14-16 show manufacturing steps according to an alternative process.

Figure 9:
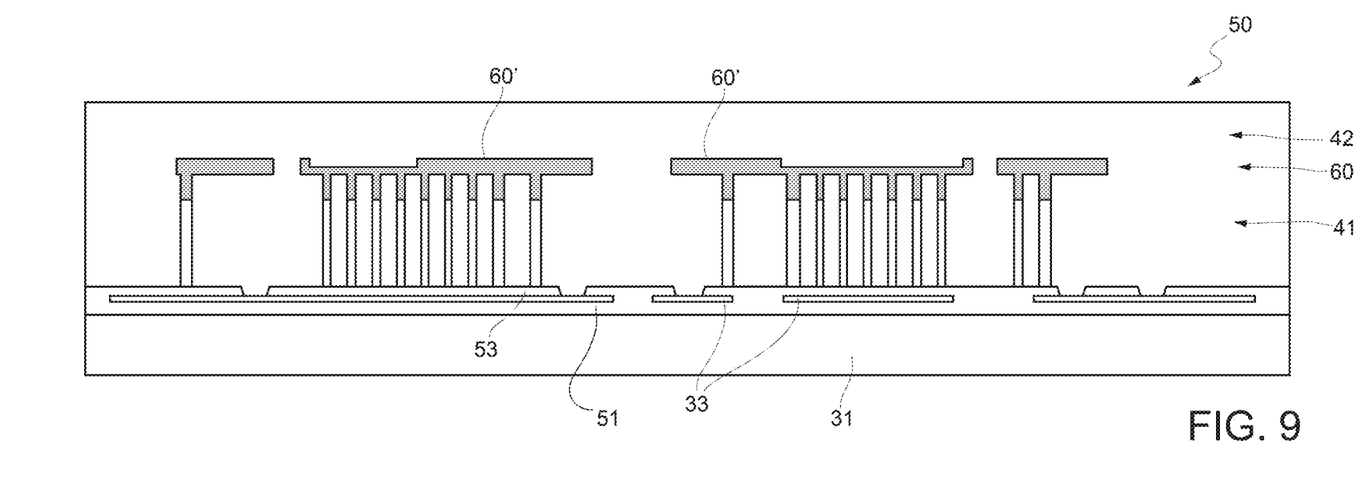

In detail, FIG. 14 shows the wafer 50 after the step of FIG. 9, and thus already comprising the first and the second epitaxial layers 41, 42, embedding the hard masking regions (here referred to as first hard masking regions 60') between each other; the first trenches 58, partially filled with portions of the second sacrificial layer 60, are also present.

In FIG. 14, the electrical connection regions 65 (one in this figure) are formed on the second epitaxial layer 42 and the wafer 50 is etched to define the upper electrodes 36A, 36B. To this end, the wafer 50 is covered by a different second trench mask, indicated herein by 81, and dry etched for removing the exposed portions of the second epitaxial layer 42 only. The etching stops completely here on the first hard masking regions 60' and leads to the formation of the second trenches 67 extending between the upper electrodes 36A, 36B.

Then, FIG. 15, the second trench mask 81 is removed, the electrical connection regions 65 (one in this figure) are formed on the upper surface of the overall epitaxial layer 64 and second hard masking regions 82 are formed on the surface of the wafer 50 to protect the second trenches 67. For example, the second hard masking regions 82 are formed by depositing and defining a further sacrificial layer such as TEOS (which may fill here part of the second trenches 67). In this manner, resist, which is more difficult to remove subsequently, is prevented from entering the second trenches 67.

Subsequently, a third trench mask 85, for example of resist, is formed and covers the surface of the wafer 50, comprising the second hard masking regions 82 and the electrical connection regions 65, and exposes the surface of the overall epitaxial layer 64 where it is desired to form the third trenches 68, extending through the entire overall epitaxial layer 64, or where it is desired to form the cavities 69, extending only through the second epitaxial layer 42, over the lower structures protected by the first hard masking regions 60'.

Then, FIG. 16, the second and the first epitaxial layers 42, 41 are selectively removed, forming the third trenches 68 and the cavities 69.

Then, the third trench mask 85, the second hard masking regions 82 (comprising the portions inside the second trenches 67), the first hard masking regions 60' (comprising the portions inside the first trenches 58) as well as the exposed portions of the first sacrificial layer 53 are removed, thus releasing the micromechanical structures 35, 40 and forming the first and the second gap zones 77, 78.

Then, the final steps already described with reference to FIG. 12 and leading to the MEMS device 30 of FIG. 3 follow.

With the solution of FIGS. 14-16, a high dimensional precision may be obtained, since the size of the openings in the second trench mask 81 (intended for the definition of the second, narrower, trenches 67) and in the third trench mask 85 (intended for the definition of the third, wider, trenches 68 and of the cavities 69) may be better controlled with reference to the specific widths of the trenches and of the zones to be removed.

The MEMS device and the manufacturing process described herein have numerous advantages.

In particular, they allow multiple micromechanical structures of a variety of types to be arranged in a single die, allowing the overall size to be reduced, reducing manufacturing costs, improving the integration in portable devices, where the device footprint is important, both in terms of space and costs.

The size and specifically the thickness of the various regions may be selected very freely, based on the desired structures, and with high dimensional control. For example, structures that have high mass, such as gyroscopes, in the lower epitaxial layer, and thinner structures, such as accelerometers, in the upper epitaxial layer, may be formed; or the full thickness of the overall epitaxial layer 64 may be used for forming a single structure which has very high thickness. In general, high sensitivity, linked to the mass of the sensitive region may be obtained due to the obtainable high thicknesses.

Furthermore, as explained, it is possible to form structures with at least three different base heights, which may be modulated as explained hereinabove for the upper electrodes 36A, 36B.

The process is particularly reliable, since it is based on well-known single process steps and there are no critical intermediate steps or structures. Thus, the MEMS device has high reliability.

It is possible to stack two or more different structures, which are monolithic to each other and thus have high behavioral uniformity and stability with regard to manufacturing imperfections and spreads, disturbances and external actions, stress and variations over time.

The process allows to form optimized stop structures that are less sensitive to external influences with respect to the known solutions, such as for example the Z-stopper structure 38 wherein both abutment portions are anchored to the substrate and thus undergo equal stress and deformations, thus making the MEMS device more resistant and reliable.

Finally, it is clear that modifications and variations may be made to the manufacturing process and to the MEMS device described and illustrated herein without thereby departing from the protective scope of the present disclosure, as defined in the attached claims.

For example, if desired, a third level may be formed, growing a third epitaxial layer and thus increasing the available height levels and/or the number of integratable structures.

Furthermore, although the structures shown are capacitive sensors, the process may be used to form drive structures as well, also exploiting different physical principles, for example systems based on electrostatic actuation.

As discussed hereinabove, the Z-stopper structure 38 may be a bottom abutment region 76 in the first epitaxial layer 41 and an upper abutment region 75 in the second epitaxial layer 42 of different shape.

In some embodiments, a process for manufacturing a MEMS device (30) may be summarized as comprising: forming a first structural layer (41) of semiconductor material on a substrate (31), the first structural layer having a first thickness; forming a plurality of first trenches (58) extending through the first structural layer (41) and defining first functional elements (37A, 37B); forming masking regions (60') on the first structural layer, the masking regions being separated from each other by first openings (62); forming a second structural layer (42) of semiconductor material on the first structural layer (41) and on the masking regions (60'), the second structural layer having a second thickness, being in direct contact with the first structural layer (41) at the first openings (62) and forming here, together with the first structural layer, thick structural regions (64) of the semiconductor material having a third thickness equal to the sum of the first and the second thicknesses; forming a plurality of second trenches (67) extending through the second structural layer (42), over the masking regions (60'); and forming a plurality of third trenches (68) extending through the first and the second structural layers (41, 42) by removing selective portions of the thick structural regions (64).

In some embodiments, the second trenches (67) delimit first functional regions (36A, 36B) having the second thickness; the third trenches (68) delimit second functional regions (45, 70) having the third thickness; the process further includes removing selective portions of the second structural layer (42) to form cavities (69) over the masking regions (60') while forming third trenches (68), forming third regions (71) having the first thickness.

In some embodiments, forming second trenches (67) and forming third trenches (68) comprise using a single etching mask (66).

In some embodiments, forming second trenches (67) and forming third trenches (68) comprise using two distinct etching masks (81, 85).

In some embodiments, the third trenches (68) have greater width than the second trenches (67).

In some embodiments, forming masking regions (60') comprises forming a masking sacrificial layer (60) and patterning the masking sacrificial layer.

In some embodiments, the further includes removing the masking regions (60') and forming first gap zones (77) between the first and the second structural layers (41, 42).

In some embodiments, the method includes, before forming a first structural layer (41), forming a sacrificial anchoring layer (53) over the substrate (31), the sacrificial anchoring layer having anchoring openings (55), and removing the masking regions (60') comprises removing the sacrificial anchoring layer (53) and forming second gap zones (78) between the first structural layer (41) and the substrate (31).

In some embodiments, the method includes forming a vertical stop structure (38) including forming a bottom abutment region (76) in the first structural layer (41) and forming an upper abutment region (75) in the second structural layer (42), the bottom abutment region (76) having the first thickness and being delimited, at least partially, by a first trench (58) belonging to the plurality of first trenches and/or by a lower portion of an abutment trench (68) belonging to the plurality of third trenches (68) and the upper abutment region (75) being superimposed to the bottom abutment region (76), being separated from the bottom abutment region by a first gap zone (77) of the plurality of first gap zones.

In some embodiments, the upper abutment region (75) is delimited by a second trench (68) belonging to the plurality of second trenches and/or by an upper part of the abutment trench (68).

In some embodiments, forming a plurality of first trenches (58) comprises defining first functional elements (37A, 37B) and forming a plurality of second trenches (67) comprises defining second functional elements (36A, 36B).

In some embodiments, a MEMS device (30) may be summarized as including: a substrate (31); a first structural layer (41) having a first thickness and extending on the substrate; a second structural layer (42) having a second thickness and extending on the first structural layer; a plurality of first trenches (58) extending through the first structural layer (41) and defining first functional elements (37A, 37B); a plurality of second trenches (67) extending through the second structural layer (42) and defining second functional elements (36A, 36B) superimposed to the first functional elements; and a plurality of third trenches (68) extending through the first and the second structural layers (41, 42), wherein the first and the second structural layers form a supporting structure (72), having a third thickness equal to the sum of the first and the second thicknesses, anchored to the substrate (31) and supporting the first and the second functional elements (37A, 37B, 36A, 36B), and wherein a first gap zone (77) extends between the first and the second functional elements and surrounds the supporting structure (72).

In some embodiments, the MEMS device further includes: a vertical stop structure (38) including a bottom abutment region (76) and an upper abutment region (75) superimposed to each other, the bottom abutment region (76) extending in the first structural layer (41), having the first thickness and being delimited, at least partially, by a first trench (58) belonging to the plurality of first trenches and/or by a lower portion of an abutment trench (68) belonging to the plurality of third trenches, and the upper abutment region (75) extending in the second structural layer (42), having the second thickness, and separated from the bottom abutment region (75) by an abutment gap area (77).

In some embodiments, the upper abutment region (75) is delimited by a second trench (68) belonging to the plurality of second trenches and/or by an upper part of the abutment trench (68).

In some embodiments, the MEMS device further includes: first functional regions (75) having the second thickness and delimited by the second or the third trenches (67, 68); second functional regions (70) having the third thickness and delimited by the third trenches (68); and third functional regions (71) having the first thickness and delimited by the first trenches (58) and/or by lower portions of the third trenches (68).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A MEMS device, comprising:
    a substrate;
    a first structural layer having a first thickness and extending on the substrate;
    a second structural layer having a second thickness and extending on the first structural layer;
    a plurality of first trenches extending through the first structural layer and defining first functional elements;
    a plurality of second trenches extending through the second structural layer and defining second functional elements overlying the first functional elements; and
    a plurality of third trenches extending through the first and the second structural layers,
    wherein the first and the second structural layers form a supporting structure, the supporting structure having a third thickness equal to the sum of the first and the second thicknesses, and the supporting structure being anchored to the substrate and supporting the first and the second functional elements,
    wherein one or more respective third trenches of the plurality of third trenches have the third thickness, and
    wherein a first gap zone extends between the first and the second functional elements and surrounds the supporting structure.

2. The MEMS device according to claim 1, further comprising:
    a vertical stop structure including a bottom abutment region and an upper abutment region overlying the bottom abutment region,
    wherein the bottom abutment region extends in the first structural layer, having the first thickness and being delimited, at least partially, by a first trench belonging to the plurality of first trenches or by a lower portion of an abutment trench belonging to the plurality of third trenches, and
    wherein the upper abutment region extends in the second structural layer, having the second thickness, and separated from the bottom abutment region by an abutment gap area.

3. The MEMS device according to claim 2, wherein the upper abutment region is delimited by a second trench belonging to the plurality of second trenches or by an upper part of the abutment trench.

4. The MEMS device according to claim 1, further comprising:
    first functional regions having the second thickness and delimited by the second or the third trenches;
    second functional regions having the third thickness and delimited by the third trenches; and
    third functional regions having the first thickness and delimited by the first trenches or by lower portions of the third trenches.

5. The MEMS device according to claim 1, wherein the second functional elements have a width that is greater than a width of the first functional elements.

6. A device, comprising:
    a substrate;
    a first semiconductor layer having a first thickness and on the substrate;
    a plurality of first trenches extending through the first semiconductor layer to the substrate;
    a second semiconductor layer on the first semiconductor layer, the second semiconductor layer directly contacting the first semiconductor layer;
    a plurality of second trenches extending through the second semiconductor layer to the first semiconductor layer; and
    a plurality of third trenches through the first and second semiconductor layers to the substrate;

a stopper structure including:
    an abutment pillar of the first semiconductor layer, the abutment pillar being anchored relative to the substrate; and
    a wall of the first semiconductor layer and of the second semiconductor layer, the wall including:
        a portion extending from the substrate in a first direction; and
        a projecting arm that extends from the portion in a second direction transverse to the portion, the projecting arm overlaps the abutment pillar and is spaced apart from the abutment pillar by a gap and at least one respective first trench of the plurality of first trenches.

7. The device of claim 6, comprising a central anchor that includes the first and second semiconductor layers.

8. The device of claim 7 including a plurality of suspended first electrodes adjacent to the central anchor, the plurality of suspended electrodes being in the first semiconductor layer.

9. The device of claim 8, comprising a plurality of second electrodes adjacent to the central anchor, the plurality of second electrodes being in the second semiconductor layer.

10. The device of claim 9 wherein the plurality of second electrodes are further from a substrate than the plurality of suspended first electrodes.

11. The device of claim 10 wherein the plurality of second electrodes are in a different pattern and arrangement than the plurality of suspended first electrodes.

12. A MEMS device, comprising:
    a substrate;
    an insulating layer on the substrate;
    one or more conductive regions on the insulating layer;
    a first structural layer of semiconductor material on the insulating layer and on the one or more conductive regions;
    a plurality of first electrodes in the first structural layer;
    a second structural layer of semiconductor material on the first structural layer and spaced from the substrate by the first structural layer;
    a plurality of second electrodes extending through the second structural layer; and
    a plurality of trenches extending through the first and the second structural layers; and
    a stopper structure including:
        an abutment pillar of the first structural layer, the abutment pillar being coupled to a respective conductive region of the one or more conductive regions; and
        a wall of the first structural layer and of the second structural layer, the wall including:
            a portion coupled to the insulating layer that extends from the insulating layer in a first direction; and
            a projecting arm that extends from the portion in a second direction transverse to the portion, the projecting arm overlaps the abutment pillar and is spaced apart from the abutment pillar by a gap and at least one respective first trench of the plurality of first trenches.

13. The MEMS device of claim 12, comprising a central anchor that includes the first and second structural layers with an indentation partially between the first and second structural layers.

14. The MEMS device of claim 13, comprising a third electrode in the substrate, the central anchor coupled to the third electrode and the plurality of first electrodes suspended over the third electrode.

15. The MEMS device of claim 14 wherein the plurality of first electrodes have a first dimension in a first direction that is transverse to a surface of the substrate, the plurality of second electrodes have a second dimension in the first direction, the second dimension is smaller than the first dimension.

16. The MEMS device of claim 15 wherein the central anchor has a third dimension in the first direction, the third dimension is greater than the first dimension.

* * * * *